US009997387B2

(12) United States Patent
Murata et al.

(10) Patent No.: US 9,997,387 B2
(45) Date of Patent: Jun. 12, 2018

(54) PURGE DEVICE, PURGE SYSTEM, PURGE METHOD, AND CONTROL METHOD IN PURGE SYSTEM

(71) Applicant: MURATA MACHINERY, LTD., Kyoto (JP)

(72) Inventors: Masanao Murata, Ise (JP); Takashi Yamaji, Ise (JP); Shinji Onishi, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 60 days.

(21) Appl. No.: 15/319,092

(22) PCT Filed: Apr. 22, 2015

(86) PCT No.: PCT/JP2015/062225
§ 371 (c)(1),
(2) Date: Dec. 15, 2016

(87) PCT Pub. No.: WO2015/194255
PCT Pub. Date: Dec. 23, 2015

(65) Prior Publication Data
US 2017/0133254 A1    May 11, 2017

(30) Foreign Application Priority Data

Jun. 16, 2014 (JP) .............................. 2014-123371

(51) Int. Cl.
    H01L 21/67    (2006.01)
    H01L 21/673   (2006.01)
    H01L 21/677   (2006.01)

(52) U.S. Cl.
    CPC .. *H01L 21/67389* (2013.01); *H01L 21/67386* (2013.01); *H01L 21/67766* (2013.01)

(58) Field of Classification Search
    CPC ......... H01L 21/67389; H01L 21/67766; H01L 21/67386; H01L 21/67769
    See application file for complete search history.

(56) References Cited

U.S. PATENT DOCUMENTS 5,879,458 A * 3/1999 Roberson, Jr. .... H01L 21/67017
                                                    118/715
6,123,120 A * 9/2000 Yotsumoto ........ H01L 21/67769
                                                    141/59
(Continued)

FOREIGN PATENT DOCUMENTS

JP    2000-332095 A    11/2000
JP    2010-182747 A    8/2010
(Continued)

OTHER PUBLICATIONS

European Search Report for related EP Patent Application No. 15810206.1; dated Feb. 9, 2018; 8 pages.

(Continued)

*Primary Examiner* — Nicolas A Arnett
(74) *Attorney, Agent, or Firm* — Procopio, Cory, Hargreaves & Savitch LLP

(57) ABSTRACT

A purge device configured to purge the inside of a storage container storing a product with purge gas includes a plurality of placing units, each configured to place the storage container thereon, a plurality of supply pipes configured to supply purge gas to the storage container placed on the corresponding placing unit, a main pipe connected to the supply pipes and configured to supply the purge gas to the supply pipes, and an MFC configured to adjust the flow rate of the purge gas in the main pipe.

13 Claims, 5 Drawing Sheets

(56) References Cited

U.S. PATENT DOCUMENTS

| | | | | |
|---|---|---|---|---|
| 8,240,346 B2* | 8/2012 | Goto | ................ | H01L 21/67389 141/192 |
| 8,942,844 B2* | 1/2015 | Takahara | ................ | B65G 1/06 700/213 |
| 9,064,918 B2* | 6/2015 | Takahara | .......... | H01L 21/67769 |
| 9,199,793 B2* | 12/2015 | Takahara | ................ | B65G 1/16 |
| 9,245,781 B2* | 1/2016 | Takahara | .......... | H01L 21/67393 |
| 9,266,629 B2* | 2/2016 | Takahara | ................ | B65B 5/00 |
| 9,457,955 B2* | 10/2016 | Omori | ..................... | B65G 1/02 |
| 9,524,893 B2* | 12/2016 | Takahara | .......... | H01L 21/67769 |
| 9,595,461 B2* | 3/2017 | Takahara | ................ | F17C 13/02 |
| 9,607,873 B2* | 3/2017 | Liao | ................. | H01L 21/67389 |
| 9,695,509 B2* | 7/2017 | Hirano | ............. | H01L 21/67017 |
| 9,818,634 B2* | 11/2017 | Omori | .............. | H01L 21/67769 |
| 9,822,929 B2* | 11/2017 | Shin | ........................ | F17C 5/007 |
| 9,878,353 B2* | 1/2018 | Murata | ..................... | B08B 5/02 |
| 9,895,723 B2* | 2/2018 | Iwamoto | ................ | B08B 5/00 |
| 9,911,635 B2* | 3/2018 | Hirano | ............. | H01L 21/67389 |
| 2001/0042439 A1* | 11/2001 | Roberson, Jr. | .... | H01L 21/67017 95/8 |
| 2005/0069420 A1* | 3/2005 | Miyajima | ......... | H01L 21/67017 417/53 |
| 2008/0156069 A1* | 7/2008 | Murata | ................. | G01D 21/00 73/19.04 |
| 2009/0053017 A1 | 2/2009 | Shmuelov | | |
| 2010/0000625 A1* | 1/2010 | Goto | ................ | H01L 21/67389 141/4 |
| 2010/0089491 A1* | 4/2010 | Pan | ................... | H01L 21/67766 141/21 |
| 2013/0158701 A1* | 6/2013 | Nomura | ........... | H01L 21/67766 700/214 |
| 2014/0000757 A1 | 1/2014 | Takahara et al. | | |
| 2014/0003893 A1 | 1/2014 | Takahara et al. | | |
| 2014/0014225 A1* | 1/2014 | Takahara | .......... | H01L 21/67769 141/4 |
| 2014/0014229 A1* | 1/2014 | Takahara | ................. | B65B 5/00 141/129 |
| 2014/0017040 A1* | 1/2014 | Takahara | .......... | H01L 21/67393 414/222.01 |
| 2014/0112739 A1* | 4/2014 | Hirano | ............. | H01L 21/67017 414/217.1 |
| 2015/0000591 A1* | 1/2015 | Kawasaki | ......... | H01L 21/67253 118/695 |
| 2015/0000759 A1* | 1/2015 | Takahara | ................ | F17C 13/02 137/15.04 |
| 2015/0000785 A1* | 1/2015 | Shin | ........................ | F17C 5/007 141/4 |
| 2015/0003941 A1* | 1/2015 | Takahara | ................. | B65G 1/16 414/269 |
| 2015/0202664 A1* | 7/2015 | Murata | ............. | H01L 21/67769 134/25.5 |
| 2015/0380288 A1* | 12/2015 | Hirano | ............. | H01L 21/67379 438/597 |
| 2016/0351427 A1* | 12/2016 | Murata | ..................... | B08B 5/04 |
| 2016/0358799 A1* | 12/2016 | Murata | ............. | H01L 21/67389 |
| 2017/0140949 A1* | 5/2017 | Onishi | ................ | H01L 21/673 |
| 2018/0076055 A1* | 3/2018 | Abe | ..................... | H01L 21/673 |
| 2018/0076073 A1* | 3/2018 | Abe | ................. | H01L 21/67389 |
| 2018/0076078 A1* | 3/2018 | Tanaka | ............. | H01L 21/67769 |

FOREIGN PATENT DOCUMENTS

| | | |
|---|---|---|
| JP | 2013-131712 A | 7/2013 |
| JP | 2013-133193 A | 7/2013 |
| JP | 5236518 B2 | 7/2013 |

OTHER PUBLICATIONS

International Search Report and Written Opinion for PCT App No. PCT/JP2015/062225 dated Jun. 9, 2015, 9 pgs.

* cited by examiner

PURGE DEVICE, PURGE SYSTEM, PURGE METHOD, AND CONTROL METHOD IN PURGE SYSTEM

This application is a National Stage entry of PCT Application No. PCT/JP2015/062225, filed on Apr. 22, 2015, which claims priority to Japanese Patent Application No. 2014-123371, filed on Jun. 16, 2014, the contents of which is incorporated herein by reference in its entirety.

TECHNICAL FIELD

The present invention relates to a purge device, a purge system, a purge method, and a control method in the purge system for purging the inside of a storage container storing a product therein with purge gas such as inert gas and clean dry air.

BACKGROUND ART

Related art purge devices inject purge gas into a storage container that stores a product such as a semiconductor wafer and a glass substrate, for keeping the inside of the storage container clean (in other words, purging). On such purge devices, for example, there is a requirement to inject the purge gas into the storage container at a desired flow rate, and/or based on a desired injecting pattern.

A related art purge device disclosed in Patent Literature 1 is known as a technique to meet the above-noted requirement. The purge device has supply means for supplying purge gas into a storage container on each shelf, aligned in the vertical and the lateral directions, and a mass flow controller (MFC) provided to each supply means and allowing adjustment of a supply flow rate of the purge gas. The purge device in this configuration can freely adjust the flow rate for injection or the injecting pattern on each storage container placed on the shelf.

CITATION LIST

Patent Literature

[Patent Literature 1] Japanese Unexamined Patent Publication No. 2013-131712

SUMMARY OF THE INVENTION

Technical Problem

Providing the mass flow controller to each supply means disposed on the shelf problematically increases the cost and makes the configuration complicated.

It is therefore an object of the present invention to provide a purge device, a purge system, a purge method, and a control method in the purge system that allow injection of purge gas at a desired flow rate and/or based on a desired injecting pattern at a low cost and in a simple configuration.

Solution to Problem

A purge device according to an aspect of the present invention is a purge device purging the inside of a storage container configured to store a product with purge gas. The purge device includes a plurality of placing units each configured to place the storage container thereon, a plurality of supply pipes each configured to supply the purge gas to the storage container placed on the corresponding placing unit, a main pipe connected to the supply pipes and configured to supply the purge gas to the supply pipes, and a flow rate adjusting unit configured to adjust a flow rate of the purge gas in the main pipe.

A purge method according to an aspect of the present invention is a method for purging the inside of a storage container storing a product with purge gas. The method includes connecting supply pipes configured to supply the purge gas to a plurality of placing units each configured to place the storage container thereon, connecting a main pipe configured to supply the purge gas to the supply pipes, and adjusting a flow rate of the purge gas in the main pipe.

In the purge device and the purge method configured as above, the main pipe supplying the purge gas to the supply pipes is provided with the flow rate adjusting unit, which can reduce the number of flow rate adjusting units to be installed compared with the configuration providing the flow rate adjusting unit to each of the supply pipes. Consequently, a purge device capable of injecting the purge gas at a desired flow rate and/or based on a desired injecting pattern can be provided at a low cost and in a simple configuration.

In an embodiment of the present invention, when supplying the purge gas to the storage container at a target supply flow rate, the flow rate adjusting unit may increase the flow rate of the purge gas in the main pipe in a continuous or stepwise manner to obtain the target supply flow rate.

The purge device in this configuration can prevent a sudden change in the gas flow in the storage container, which can accordingly reduce dust swirling inside the storage container.

In an embodiment of the present invention, the supply pipes may have an adjusting unit configured to adjust the flow rate of the purge gas supplied to the respective storage containers to a flow rate equally shared between the supply pipes. When supplying the purge gas to the storage containers at a target supply flow rate, the flow rate adjusting unit may adjust the flow rate of the purge gas in the main pipe to a flow rate calculated by multiplying the target supply flow rate by the number of placing units.

The purge device in this configuration requires no consideration about differences in conditions such as the presence or absence of a storage container on the placing unit and pressure losses caused by pipes. The purge device can thus inject the purge gas into the storage container at a desired flow rate and/or based on a desired injecting pattern simply by adjusting the flow rate of the purge gas in the main pipe to "a flow rate calculated by multiplying a target supply flow rate by the number of placing units".

In an embodiment of the present invention, each of the supply pipes may have an on-off valve configured to open a flow path of the purge gas in the supply pipe when the storage container is placed on the corresponding placing unit and to close the flow path of the purge gas when no storage container is placed on the placing unit. When supplying the purge gas to the storage container at a target supply flow rate, the flow rate adjusting unit may adjust the flow rate of the purge gas in the main pipe to a flow rate calculated by multiplying the target supply flow rate by the number of storage containers placed on the placing units.

In the purge device in this configuration, the on-off valve allows the purge gas to be supplied only to the supply pipe of the placing unit on which a storage container is placed. Information whether the storage container is placed on the placing unit can be obtained, for example, from a sensing unit configured to sense the presence of the storage container on the placing unit or from information sent from a host controller. Consequently, the purge device can inject the purge gas into the storage container at a desired flow rate and/or based on a desired injecting pattern simply by adjusting the flow rate of the purge gas in the main pipe to "a flow rate calculated by multiplying a target supply flow rate by the number of storage containers placed on the placing units".

In an embodiment of the present invention, the purge device may further include a sensing unit configured to sense whether each of the placing units places the storage container thereon.

The purge device in this configuration can more definitely acquire information as to whether the storage container is placed on the placing unit.

A purge system according to an aspect of the present invention includes a plurality of purge devices, each of the purge devices being the above-described purge device, a transferring device configured to transfer the storage container, and a control unit configured to control transfer of the storage container by the transferring device. The control unit controls the transferring device to preferentially load the storage container onto the placing unit, on which no storage container is placed, that is included in the purge devices from the purge device having the placing unit on which the storage container is placed.

A control method according to an aspect of the present invention is a control method for a purge system including a plurality of purge devices purged by the above-described purge method, a transferring device configured to transfer a storage container, and a control unit configured to control transfer of the storage container by the transferring device. The control method controls the transferring device to preferentially load the storage container onto the placing unit on which no storage container is placed that is included in, out of the purge devices, the purge device having the placing unit on which the storage container is placed.

The purge system and the control method in this configuration adjust the flow rate of the purge gas in the main pipe to 0 if none of the placing units out of the placing units have storage containers placed thereon and adjust the flow rate of the purge gas in the main pipe to a certain flow rate if one or more placing units out of the placing units have respective storage containers placed thereon. Furthermore, less purge gas is unnecessarily discharged by controlling the transferring device to preferentially load a storage container onto such a placing unit that is included in, out of the purge devices, the purge device having the placing unit on which the storage container is placed.

Advantageous Effects of Invention

According to the present invention, purge gas can be injected at a desired flow rate and/or based on a desired injecting pattern in a low-cost and simple configuration.

DESCRIPTION OF EMBODIMENTS

Figure 1:
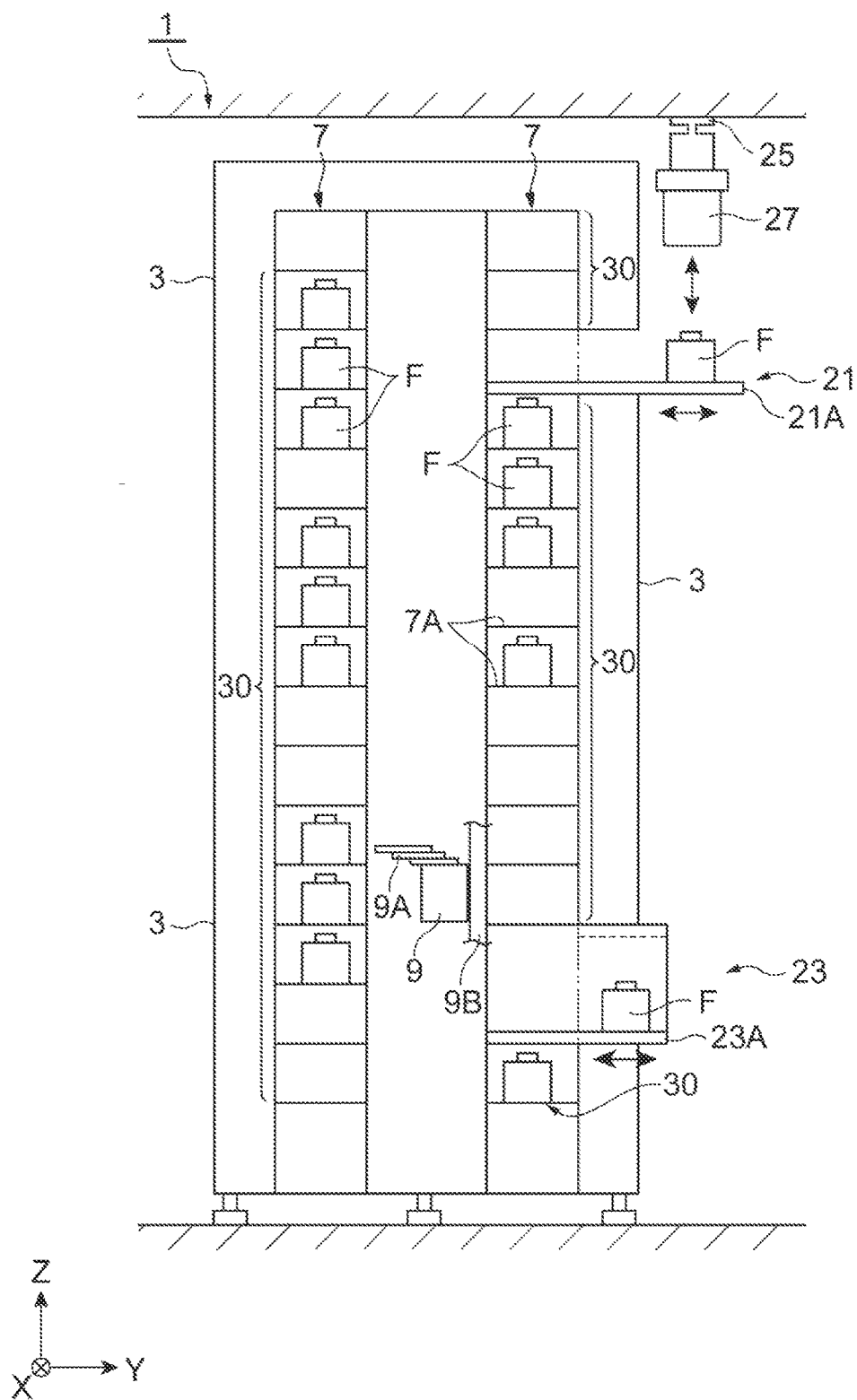
FIG. 1 is a side view of a purge stocker including a purge device according to a first embodiment.

An embodiment will be described below with reference to the drawings. In description of the drawings, like numerals indicate like components, and overlapping description will be omitted. The scale in the drawings does not necessarily coincide with the size of a described object.

First Embodiment

A purge stocker (a purge system) 1 including a purge device 30 according to a first embodiment will now be described. The purge stocker 1 purges the inside of a storage container F, examples of which include a front opening unified pod (FOUP), storing a product such as a semiconductor wafer and a glass substrate with purge gas (for example, nitrogen gas) and serves as a stocker storing a plurality of storage containers F. The purge stocker 1 is installed, for example, in a clean room.

Figure 2:
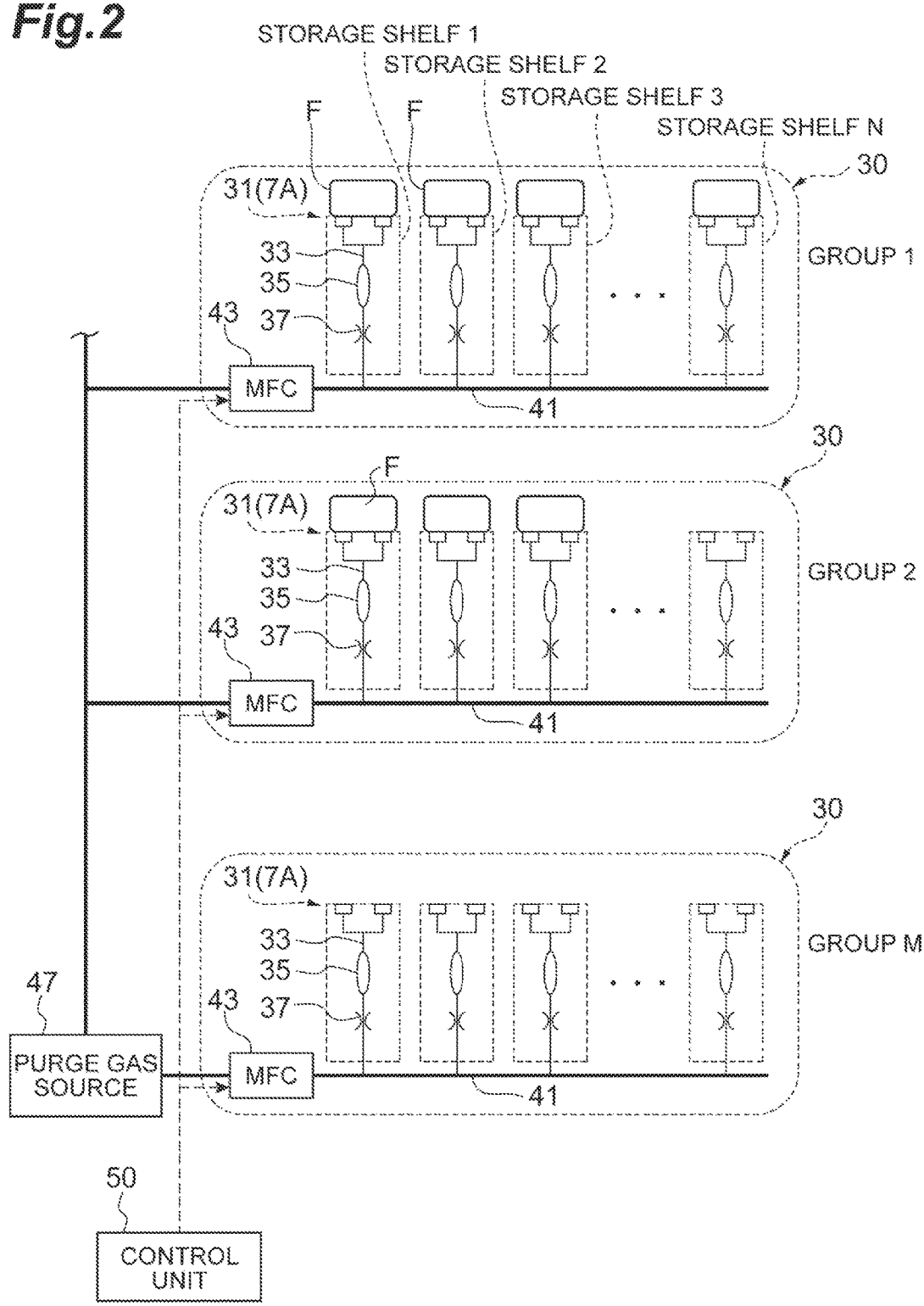
FIG. 2 is a schematic configuration diagram illustrating the configuration of the purge device according to the first embodiment.

As illustrated in FIG. 1, the purge stocker 1 mainly includes a partition 3, racks 7, a crane (a transferring device) 9, an overhead hoist transfer (OHT) port 21, a manual port 23, purge devices 30, and a control unit 50 (see FIG. 2).

The partition 3 is a covering plate of the purge stocker 1 and forms a storage area storing the storage containers F inside the partition 3. The racks 7 are parts for retaining the storage containers F, and one or two rows (two rows in this example) of racks 7 are usually equipped in the storage area. The racks 7 extend in a certain direction X and are disposed substantially parallel to each other such that adjacent two racks 7, 7 are opposite to each other. Each rack 7 has a plurality of storage shelves 7A, which store respective storage containers F in a manner having the storage containers F placed thereon, along the certain direction X and the vertical direction Z.

The crane 9 is a mechanism for loading and unloading the storage containers F into/from the storage shelves 7A and transferring the storage containers F between the storage shelves 7A. The crane 9 is disposed in a region sandwiched between the racks 7, 7 opposite to each other. The crane 9 runs on a transport rail (not illustrated) set on the floor surface along the direction X in which the rack 7 extends, thereby moving in the certain direction X along the rack 7. A stage 9A of the crane 9 is movable upward and downward along a guide rail 9B, whereby the stage 9A can load and unload the storage containers F into and from a plurality of storage shelves 7A aligned in the vertical direction.

The storage container F is loaded into and unloaded from the purge stocker 1 through the OHT port 21 and the manual port 23. The OHT port 21 is configured for receiving and releasing the storage container F between the purge stocker 1 and a ceiling vehicle (OHT) 27 running on a transport rail 25 set on the ceiling and has a conveyor 21A for conveying the storage container F. The manual port 23 is configured for receiving and releasing the storage container F between the operator and the purge stocker 1 and has a conveyor 23A for conveying the storage container F.

The purge device 30 purges the inside of the storage container F with the purge gas. As illustrated in FIG. 2, the purge device 30 includes N (a plurality of) placing units 31, N (a plurality of) supply pipes 33, a main pipe 41 having the N supply pipes 33 connected thereto, and a mass flow controller (MFC) (a flow rate adjusting unit) 43 adjusting the flow rate of purge gas in the main pipe 41. The purge stocker 1 in the first embodiment includes M (a plurality of) sets of purge devices 30 each including the above-described components. In the following description, the purge device 30 may be referred to as "a purge device 30 belonging to a group 1", "a purge device 30 belonging to a group 2", and the like. The purge gas is supplied to each purge device 30 from a purge gas source 47. The purge gas source 47 is a tank for storing the purge gas.

The placing unit 31 where the storage container F is placed. One placing unit 31 is disposed on one storage shelf 7A. The supply pipe 33 supplies the purge gas to the storage container F placed on the placing unit 31. The supply pipe 33 forms a nozzle in its front end, and with the nozzle closely attached to a supply opening of the storage container F, the purge gas is supplied into the storage container F.

The supply pipe 33 is provided with a particle filter 35 and an orifice (an adjusting unit) 37. The particle filter 35 is a filter capable of collecting dust (particles). The particle filter 35 may be provided as necessary. The orifice 37 adjusts the flow rate of the purge gas supplied from the main pipe 41 such that the flow rate is shared between a plurality of supply pipes 33.

The main pipe 41 has N supply pipes 33 connected thereto and supplies the purge gas to the N supply pipes 33. The main pipe 41 is further provided with the MFC 43 for adjusting the flow rate of the purge gas in the main pipe 41. The MFC 43 is an apparatus for measuring the mass flow rate of the purge gas traveling through the main pipe 41 and controls the flow rate. The flow rate control by the MFC 43 is controlled by the control unit 50.

The control unit 50 is a unit controlling various processes in purging performed by the purge stocker 1. The control unit 50 is an electronic control unit configured with a central processing unit (CPU), a read only memory (ROM), a random access memory (RAM), and others.

Figure 3:
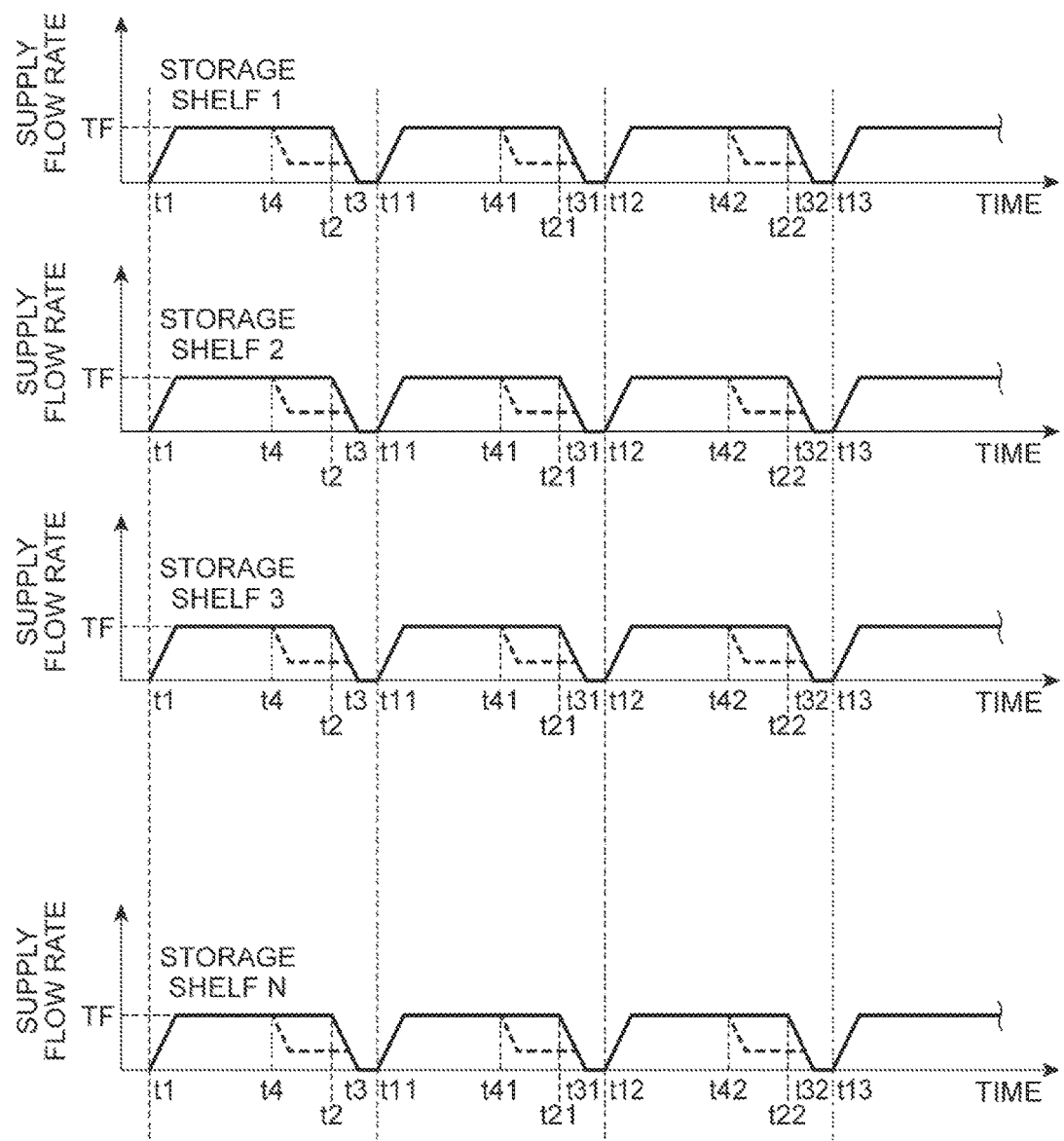
FIG. 3 is a timing chart illustrating exemplary flow rate control according to the first embodiment.

Based on information (loading plan information), which is sent from a host controller (not illustrated), on a storage shelf 7A into which the storage container F is planned to be loaded, the control unit 50 controls the MFC 43 provided to the purge device 30 including the storage shelf 7A planned to have the storage container F. Specifically, in supplying the purge gas to the storage container F placed on the placing unit 31 at a target supply flow rate TF, the control unit 50 controls the MFC 43 to adjust the flow rate of the purge gas in the main pipe 41 to a flow rate calculated by multiplying the target supply flow rate TF by the number N of placing units 31 (the storage shelves 7A). In this process, as illustrated in FIG. 3, the control unit 50 controls the MFC 43 to gradually (continuously) increase the flow rate of the purge gas in the main pipe 41 to obtain the target supply flow rate TF. The control unit 50 may increase the flow rate of the purge gas in the main pipe 41 in a stepwise manner to obtain the target supply flow rate TF.

Purging operations by the purge device 30 will now be described. FIG. 3 illustrates a supply flow rate of the purge gas supplied to each storage container F placed on the placing unit 31 of the storage shelf 7A belonging to the group 1 and a timing of the supply. In other words, FIG. 3 illustrates a supply flow rate of the purge gas supplied from the supply pipe 33 belonging to the group 1 and a timing of the supply.

Based on the loading plan information (for example, information that a storage container F is planned to be loaded into a storage shelf 1 belonging to the group 1) sent from the host controller, the control unit 50 calculates the timing when the storage container F is placed on the placing unit 31. The control unit 50 controls the MFC 43 such that the supply of the purge gas (purging) to the storage container F is started at a timing (a time t1) when the storage container F is placed on the placing unit 31. Specifically, the control unit 50 controls the MFC 43 to adjust the flow rate of the purge gas in the main pipe 41 to a flow rate (TF×N) calculated by multiplying the target supply flow rate TF by the number N of placing units 31. Each supply pipe 33 is supplied with the purge gas at a flow rate calculated by dividing the flow rate (TF×N) of the purge gas flowing in the main pipe 41 by the number N of supply pipes 33. As illustrated in FIG. 3, the control unit 50 controls the MFC 43 to gradually increase the flow rate of the purge gas in the main pipe 41 to obtain the target supply flow rate TF.

When the control unit 50 receives the loading plan information (for example, information that another storage container F is planned to be loaded into a storage shelf 2 belonging to the group 1) from the host controller (a time t2) during purging on the storage container F, the control unit 50 calculates a timing (a time t11) when the storage container F (referred to as "a next storage container F") is placed on the placing unit 31 and controls the MFC 43 to gradually decrease the flow rate of the purge gas supplied to the storage container F being purged to 0 (a time t3). The control unit 50 controls the MFC 43 such that the supply of the purge gas (purging) to each storage container F is again started at a timing (the time t11) when the next storage container F is placed on the placing unit 31 (the storage shelf 2). Specifically, the control unit 50 controls the MFC 43 to adjust the flow rate of the purge gas in the main pipe 41 to a flow rate (TF×N) calculated by multiplying the target supply flow rate TF by the number N of placing units 31. Each supply pipe 33 is supplied with the purge gas at a flow rate calculated by dividing the flow rate (TF×N) of the purge gas flowing in the main pipe 41 by the number N of supply pipes 33. As illustrated in FIG. 3, the control unit 50 controls the MFC 43 to gradually increase the flow rate of the purge gas in the main pipe 41 to obtain the target supply flow rate TF.

Subsequently, when the loading plan information is sent from the host controller, the same controls performed at the above-described time t2, time t3, and time t11 are repeated at a time t21 (a time t22), a time t31 (a time t32), and a time t12 (a time t13), respectively. In the first embodiment, as illustrated in FIG. 3, the flow rate of the purge gas supplied to the storage container F and the timing of the supply are shared between all the supply pipes 33 disposed in the respective storage shelves 7A in a purge device 30.

In the purge device 30 in the above-described embodiment, the MFC 43 is provided to the main pipe 41 supplying the purge gas to a plurality of supply pipes 33. This configuration can reduce the number of MFCs 43 to be installed, compared with the configuration having the MFC 43 provided to each of the supply pipes 33. Consequently, the purge device 30 capable of injecting the purge gas at a desired flow rate and/or based on a desired injecting pattern can be provided at a low cost and in a simple configuration.

The purge device 30 in the above-described embodiment gradually increases the flow rate of the purge gas in the main pipe 41 to obtain the target supply flow rate TF, which can prevent a sudden change in the gas flow in the storage container F. This configuration can reduce dust swirling inside the storage container F.

With the orifice 37 provided to each of the supply pipes 33, the purge device 30 in the above-described embodiment does not require consideration of differences in conditions, such as the presence or absence of a storage container F on the placing unit 31 and pressure losses caused by the main pipe 41 and the supply pipes 33. The purge gas can be thus injected into a storage container F at a desired flow rate and/or based on a desired injecting pattern simply by adjusting the flow rate of the purge gas in the main pipe 41 to a flow rate calculated by multiplying the target supply flow rate TF by the number N of placing units 31 (storage shelves 7A).

Second Embodiment

The purge stocker (the purge system) 1 according to a second embodiment will now be described. In the purge stocker 1 according to the second embodiment, the control unit 50 installed in the purge stocker 1 as described above in the first embodiment controls the above-described MFC 43, and further controls a crane (a transferring device) transferring the storage container F. Specifically, the control unit 50 controls the crane 9 to preferentially load a storage container F onto such a placing unit 31 that is included in, out of a plurality of purge devices 30 belonging to the group 1 to a group M, a purge device 30 having a placing unit 31 on which a storage container F is placed and has no storage containers F placed thereon.

In the purge stocker 1 in this configuration, the control unit 50 controls the MFC 43 to adjust the flow rate of the purge gas in the main pipe 41 to 0 if none of the placing units 31 have storage containers F placed thereon, and the control unit 50 controls the MFC 43 to adjust the flow rate of the purge gas in the main pipe 41 to a flow rate calculated by multiplying the target supply flow rate TF by the number N of placing units 31 (the storage shelves 7A) if one or more placing units 31, out of the placing units 31, have respective storage containers F placed thereon.

The purge stocker 1 according to the second embodiment controls the crane 9 to preferentially load a storage container F onto a placing unit 31, on which no storage container is placed that is included in, out of the purge devices 30, a purge device 30 having another placing unit 31 on which a storage container F is placed. This configuration can reduce unnecessary discharge of the purge gas.

Third Embodiment

Figure 4:
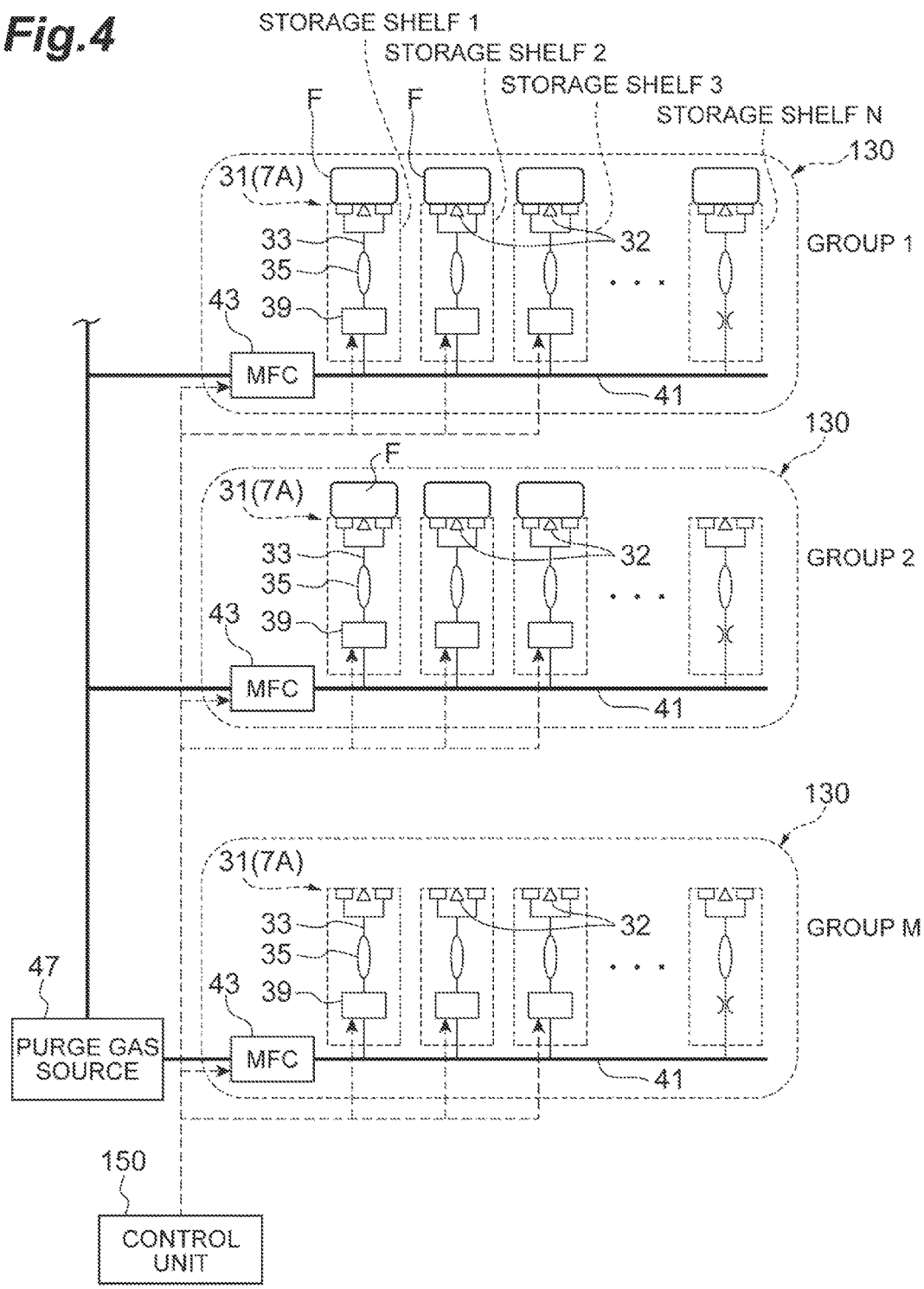
FIG. 4 is a schematic configuration diagram illustrating the configuration of a purge device according to a third embodiment.

The purge stocker 1 according to a third embodiment includes a purge device 130, as illustrated in FIG. 4, different from the purge device 30 illustrated in FIG. 2 in that the purge device 130 has an on-off valve 39, open and closure operations of which are controlled by a control unit 150, instead of (or in addition to) the orifice 37, a sensing unit 32 sensing that a storage container F is placed on the placing unit 31, and different controlled content performed by the control unit 150 on the MFC 43. The differences from the purge device 30 in the first embodiment will be described in detail while omitting description of common elements between the embodiments.

The on-off valve 39 is provided to the supply pipe 33. The on-off valve 39 opens the flow path of the purge gas in the supply pipe 33 when the placing unit 31 has a storage container F placed thereon and closes the flow path of the purge gas when the placing unit 31 has no storage containers F placed thereon. Operations of opening and closure of the on-off valve 39 of this embodiment are controlled by the later-described control unit 150. An apparatus in a remotely controllable configuration such as an electromagnetic type and an air type may be employed as the on-off valve 39.

The sensing unit 32 senses that a storage container F is placed on the placing unit 31. The sensing unit 32 is provided to each storage shelf 7A, and an optical sensor, a contact sensor, or the like is used for the sensing unit 32. When the sensing unit 32 senses that a storage container F is placed on the placing unit 31, the sensing unit 32 transmits sensed information about the placement to the control unit 150.

Figure 5:
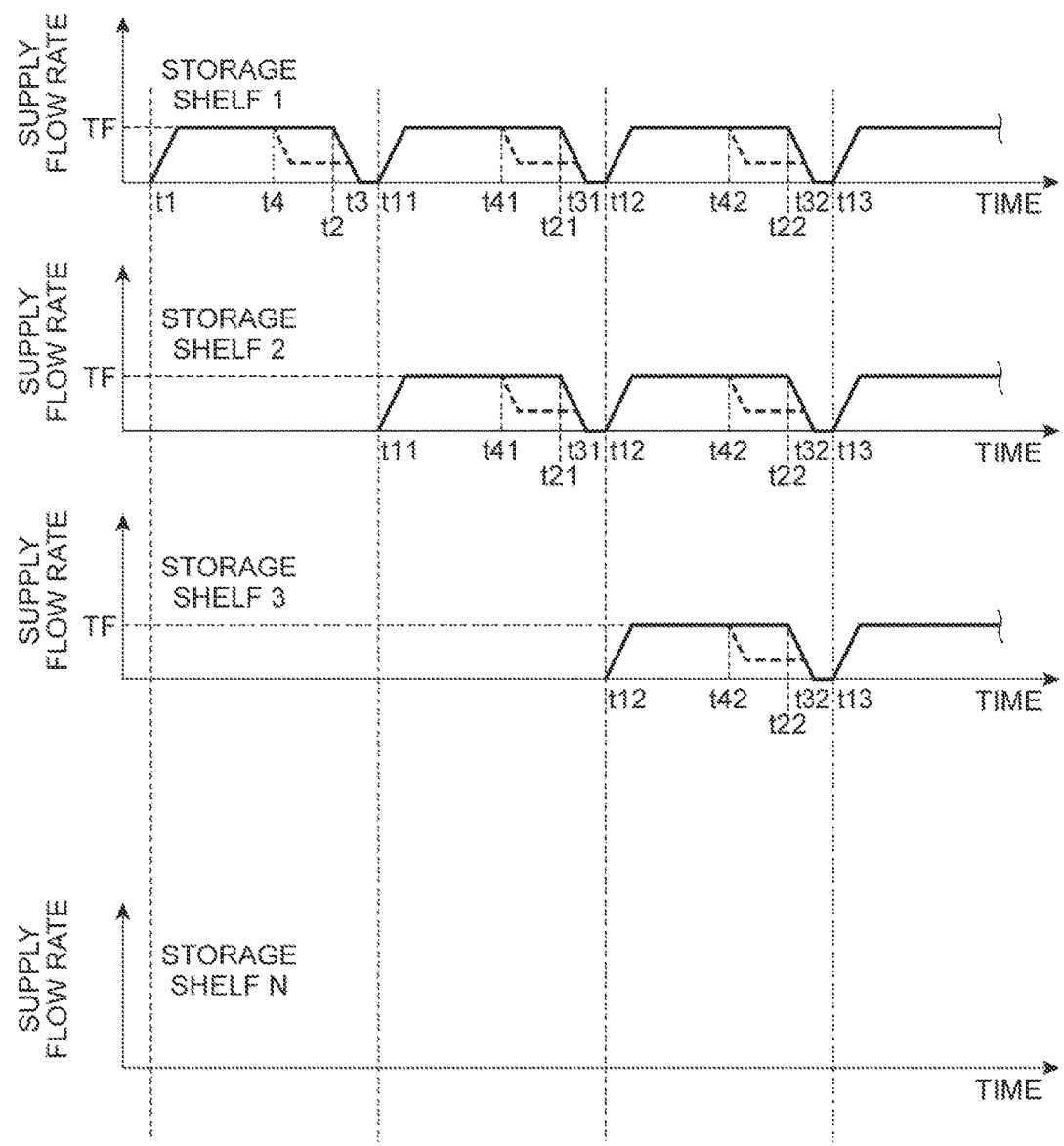
FIG. 5 is a timing chart illustrating exemplary flow rate control according to the third embodiment.

Based on information sent from a host controller (not illustrated) about a storage shelf 7A into which a storage container F is planned to be loaded and based on the sensed information sent from the sensing unit 32, the control unit 150 controls the MFC 43 provided to the purge device 30 including the storage shelf 7A planned to have the storage container F. Specifically, in supplying the purge gas to the storage container F at the target supply flow rate TF, the control unit 150 controls the MFC 43 to adjust the flow rate of the purge gas in the main pipe 41 to a flow rate (TF×n) calculated by multiplying the target supply flow rate TF by the number n of the storage containers F placed on the placing units 31. The supply pipe 33 is supplied with the purge gas at a flow rate calculated by dividing the flow rate (TF×n) flowing in the main pipe 41 by the number n of the storage containers F placed on the placing units 31. As illustrated in FIG. 5, the control unit 150 controls the MFC 43 to gradually (continuously) increase the flow rate of the purge gas in the main pipe 41 to obtain the target supply flow rate TF.

Purging operations by the purge device 130 will now be described. FIG. 5 illustrates a supply flow rate of the purge gas supplied to the storage container F placed on the placing unit 31 of each of storage shelves 1 to N belonging to the group 1 and each timing of the supply. In other words, FIG. 5 illustrates a supply flow rate of the purge gas supplied from each supply pipe 33 belonging to the group 1 and each timing of the supply.

Based on the sensed information sent from the sensing unit 32, the control unit 150 controls the MFC 43 to open the on-off valve 39 of the supply pipe 33 supplying the purge gas to the placing unit 31 corresponding to the sensing unit 32 and to start supplying the purge gas (purging) to the storage container F (a time t1). Specifically, the control unit 150 controls the MFC 43 to adjust the flow rate of the purge gas in the main pipe 41 to a flow rate (TF) calculated by multiplying the target supply flow rate TF by the number n (n=1) of storage containers placed on the placing units 31. As illustrated in FIG. 5, the control unit 150 controls the MFC 43 to gradually increase the flow rate of the purge gas in the main pipe 41 to obtain the target supply flow rate TF.

When loading plan information (for example, information that another storage container F is planned to be loaded into the storage shelf 2 belonging to the group 1) is sent from the host controller during purging on the storage container F (a time t2), the control unit 150 controls the MFC 43 to gradually decrease the flow rate of the purge gas supplied to the storage container F being purged to 0 (a time t3). At the timing when the storage container F is placed on the placing unit 31 (the storage shelf 2), in other words, at the timing when the sensed information (information that the storage container F has been placed on the placing unit 31 of the storage shelf 2) is sent from the sensing unit 32, the control unit 150 controls the MFC 43 to open the on-off valve 39 of the corresponding supply pipe 33 supplying the purge gas to the placing unit 31 and to restart supplying the purge gas (purging) to the storage container F (a time t11). Specifically, the control unit 150 controls the MFC 43 to adjust the flow rate of the purge gas in the main pipe 41 to a flow rate calculated by multiplying the target supply flow rate TF by the number n (n=2) of storage containers F placed on the placing units 31. Each supply pipe 33 is supplied with the purge gas at a flow rate (TF) calculated by dividing the flow rate (2TF) flowing in the main pipe 41 by the number n (n=2) of the storage containers F placed on the placing units 31. As illustrated in FIG. 5, the control unit 150 controls the MFC 43 to gradually increase the flow rate of the purge gas in the main pipe 41 to obtain the target supply flow rate TF.

Subsequently, when the sensed information is sent from the sensing unit 32, the same controls performed at the above-described time t2, time t3, and time t11 are repeated at a time t21 (a time t22), a time t31 (a time t32), and a time t12 (a time t13), respectively. In the third embodiment, as illustrated in FIG. 5, the supply pipes 33 provided to the respective storage shelves 7A in a purge device 30 may supply the purge gas to the storage containers F at the respective flow rates and respective timings of supply, which are different from one another. Specifically, when the placing unit 31 has no storage containers F placed thereon, the corresponding on-off valve 39 is closed. No purge gas is thus supplied to the supply pipe 33 provided to the storage shelf 7A. In this point, the purge device 130 is different from the purge device 30 of the first embodiment.

The same advantageous effects as those in the first embodiment may be exerted on the purge stocker 1 including the purge device 130 according to the third embodiment.

Embodiments of the present invention have been described as above; however, the present invention is not limited thereto. Various changes can be made without departing from the scope of the invention.

In the first embodiment, the control unit 50 is shared by a plurality of purge devices 30; however, the present invention is not limited thereto. A control unit for controlling the MFC 43 may be provided for each purge device. In the second embodiment, a control unit separately provided from a control unit for controlling the crane 9 and controlling the MFC 43 and the on-off valve 39 may be provided for each purge device.

In the first and the third embodiments, as illustrated in FIGS. 3 and 5, such an exemplary configuration has been described that the control unit 50 (150) controls the MFC to start supplying the purge gas to a storage container F at the target supply flow rate TF and to keep supplying the purge gas to the storage container F at the target supply flow rate TF until loading plan information is sent from the host controller; however, the present invention is not limited to this configuration. For example, as illustrated in FIGS. 3 and 5, the control unit 50 (150) may control the MFC to start supplying the purge gas to the storage container F at the target supply flow rate TF. When a certain time has passed (times t4, t41, and t42), the control unit 50 (150) may control the MFC to decrease the supply flow rate to a degree that can maintain the environment inside the storage container F and to continue purging.

In the first and the third embodiments, as illustrated in FIGS. 3 and 5, such an exemplary configuration has been described that the control unit 50 (150) controls the MFC 43 to gradually (continuously) increase the flow rate of the purge gas in the main pipe 41 to obtain the target supply flow rate TF; however, the present invention is not limited to this configuration. For example, the control unit 50 (150) may control the MFC 43 to instantly supply the purge gas to the storage container F at the target supply flow rate TF.

In the above-described embodiments, purge devices installed in the purge stocker 1 have been described as examples. However, the present invention is not limited thereto. For example, the present invention may be applied to purge devices installed to a relay point between ceiling vehicles, a receiving and releasing point (a loading port) between a conveyor and the ceiling vehicle, a ceiling buffer, and the like.

REFERENCE SIGNS LISTt

1 . . . purge stocker (purge system), 3 . . . partition, 7 . . . rack, 7A . . . storage shelf (storage shelves 1 to N), 9 . . . crane (transferring device), 30, 130 . . . purge device, 31 . . . placing unit, 32 . . . sensing unit, 33 . . . supply pipe, 35 . . . particle filter, 37 . . . orifice (adjusting unit), 39 . . . on-off valve, 41 . . . main pipe, 43 . . . MFC (flow rate adjusting unit), 47 . . . purge gas source, 50, 150 . . . control unit, F . . . storage container, TF . . . target supply flow rate

The invention claimed is:

1. A purge device purging an inside of a storage container configured to store a product with purge gas, the purge device comprising:
   a plurality of placing units each configured to place the storage container thereon;
   a plurality of supply pipes each configured to supply the purge gas to the storage container placed on the corresponding placing unit;
   a main pipe connected to the supply pipes and configured to supply the purge gas to the supply pipes;
   a flow rate adjusting unit configured to adjust a flow rate of the purge gas in the main pipe; and
   a control unit configured to perform a flow rate control in the flow rate adjusting unit, wherein
   when information indicative of the storage container being loaded in the future is sent from a host controller during purging of the storage container, the control unit controls the flow rate adjusting unit, such that a supply flow rate of the purge gas supplied to the storage container becomes 0 and, when the storage container corresponding to the information is placed on the corresponding placing unit, the control unit controls the flow rate adjusting unit, such that supply of the purge gas to the storage container is restarted.

2. The purge device according to claim 1, wherein, when supplying the purge gas to the storage container at a target supply flow rate, the flow rate adjusting unit increases the flow rate of the purge gas in the main pipe in one of a continuous and stepwise manner, to obtain the target supply flow rate.

3. The purge device according to claim 2, wherein
   the supply pipes have an adjusting unit configured to adjust the flow rate of the purge gas supplied to the respective storage containers to a flow rate equally shared between the supply pipes, and
   when supplying the purge gas to the storage container at a target supply flow rate, the flow rate adjusting unit adjusts the flow rate of the purge gas in the main pipe to a flow rate calculated by multiplying the target supply flow rate by a number of the placing units.

4. The purge device according to claim 2, wherein
   each of the supply pipes has an on-off valve configured to open a flow path of the purge gas in the supply pipe when the storage container is placed on the corresponding placing unit and to close the flow path of the purge gas when the storage container is not placed on the placing unit, and
   when supplying the purge gas to the storage container at a target supply flow rate, the flow rate adjusting unit adjusts the flow rate of the purge gas in the main pipe to a flow rate calculated by multiplying the target supply flow rate by the number of storage containers placed on the placing units.

5. The purge device according to claim 4 further comprising a sensing unit configured to sense whether each of the placing units places the storage container thereon.

6. A purge system comprising:
a plurality of purge devices, each of the purge devices being the purge device according to any one of claim 2, and
a transferring device configured to transfer the storage container; wherein
the control unit controls transfer of the storage container by the transferring device and controls the transferring device to preferentially load the storage container onto the placing unit on which the storage container is not placed that is included in, out of the purge devices, the purge device having another placing unit on which the storage container is placed.

7. The purge device according to claim 1, wherein
the supply pipes have an adjusting unit configured to adjust the flow rate of the purge gas supplied to the respective storage containers to a flow rate equally shared between the supply pipes, and
when supplying the purge gas to the storage container at a target supply flow rate, the flow rate adjusting unit adjusts the flow rate of the purge gas in the main pipe to a flow rate calculated by multiplying the target supply flow rate by a number of the placing units.

8. A purge system comprising:
a plurality of purge devices, each of the purge devices being the purge device according to claim 7, and
a transferring device configured to transfer the storage container; wherein
the control unit controls transfer of the storage container by the transferring device and controls the transferring device to preferentially load the storage container onto the placing unit on which the storage container is not placed that is included in, out of the purge devices, the purge device having another placing unit on which the storage container is placed.

9. The purge device according to claim 1, wherein
each of the supply pipes has an on-off valve configured to open a flow path of the purge gas in the supply pipe when the storage container is placed on the corresponding placing unit, and to close the flow path of the purge gas when the storage container is not placed on the placing unit, and
when supplying the purge gas to the storage container at a target supply flow rate, the flow rate adjusting unit adjusts the flow rate of the purge gas in the main pipe to a flow rate calculated by multiplying the target supply flow rate by a number of the storage containers placed on the placing units.

10. The purge device according to claim 9, further comprising a sensing unit configured to sense whether each of the placing units has placed the storage container thereon.

11. A purge system comprising:
a plurality of purge devices, each of the purge devices comprising the purge device according to claim 1, and
a transferring device configured to transfer the storage container;
wherein
the control unit controls transfer of the storage container by the transferring device and controls the transferring device to preferentially load the storage container onto the placing unit on which the storage container is not placed that is included in, out of the purge devices, the one of the purge devices having another placing unit on which the storage container is placed.

12. A purge method for purging the inside of a storage container configured to store a product with purge gas in a purge device connecting supply pipes configured to supply purge gas to a plurality of placing units each configured to place the storage container thereon and connecting a main pipe configured to supply the purge gas to the supply pipes, and including a flow rate adjusting unit configured to adjust a flow rate of the purge gas in the main pipe and a control unit configured to perform a flow rate control in the flow rate adjusting unit, wherein, the purge method comprising:
when information that the storage container is planned to be loaded is sent from a host controller during purging of the storage container, the control unit controls the flow rate adjusting unit such that a supply flow rate of the purge gas supplied to the storage container being purged becomes 0 and, when the storage container corresponding to the information is placed on the corresponding placing unit, the control unit controls the flow rate adjusting unit such that supply of the purge gas to the storage container is restarted.

13. A control method for a purge system including a plurality of purge devices purged by the purge method according to claim 12, a transferring device configured to transfer the storage containers, and a control unit configured to control transfer of the storage container by the transferring device, the control method comprising:
controlling the transferring device to preferentially load the storage container onto the placing unit on which the storage container is not placed that is included in, out of the purge devices, the purge device having another placing unit on which the storage container is placed.

* * * * *